US009306506B1

(12) United States Patent
Zhang et al.

(10) Patent No.: US 9,306,506 B1
(45) Date of Patent: Apr. 5, 2016

(54) APPARATUS AND METHODS FOR DUAL LOOP POWER AMPLIFIER DIGITAL PRE-DISTORTION SYSTEMS

(71) Applicant: Analog Devices Global, Hamilton (BM)

(72) Inventors: Yong Zhang, Beijing (CN); Joseph Brad Brannon, Greensboro, NC (US); John P. Oates, Thomasville, NC (US); Guanghua Man, Greensboro, NC (US); Gina G. Colangelo, Somerville, MA (US)

(73) Assignee: ANALOG DEVICES GLOBAL, Hamilton (BM)

( * ) Notice: Subject to any disclaimer, the term of this patent is extended or adjusted under 35 U.S.C. 154(b) by 0 days.

(21) Appl. No.: 14/552,306

(22) Filed: Nov. 24, 2014

(51) Int. Cl.
*H03F 1/32* (2006.01)
*H03F 3/21* (2006.01)
*H03F 3/19* (2006.01)

(52) U.S. Cl.
CPC ............... *H03F 1/3247* (2013.01); *H03F 3/19* (2013.01); *H03F 3/21* (2013.01); *H03F 2200/171* (2013.01); *H03F 2200/451* (2013.01); *H03F 2201/3215* (2013.01)

(58) Field of Classification Search
CPC ........................................................ H03F 1/3241
USPC .................................... 330/149, 75; 375/297
See application file for complete search history.

(56) References Cited

U.S. PATENT DOCUMENTS

| 8,260,145 B2 * | 9/2012 | Gupta ................. H04L 27/2096 398/115 |
| 8,699,620 B1 * | 4/2014 | Wu ......................... H04N 7/52 375/254 |
| 8,824,980 B2 | 9/2014 | McLaurin |
| 8,903,337 B2 * | 12/2014 | Kim ...................... H03F 1/3247 375/296 |
| 2012/0268191 A1 | 10/2012 | Ananthaswamy et al. |
| 2014/0233676 A1 * | 8/2014 | Zhang ................. H04B 1/0475 375/297 |

OTHER PUBLICATIONS

R.Neil Braithwaite and Scott Carichner, An Improved Doherty Amplifier Using Cascaded Digital Predistortion and Digital Gate Voltage Enhancement, 2009 International Microwave Symposium Digest, IEEE Microwave Theory and Techniques Society, Institute of Electrical and Electronics, pp. 1073-1076.
(Continued)

*Primary Examiner* — Henry Choe
(74) *Attorney, Agent, or Firm* — Knobbe, Martens, Olson & Bear LLP

(57) ABSTRACT

Apparatus and methods for dual loop power amplifier digital pre-distortion systems are disclosed. In certain implementations, a dual DPD system includes a first digital pre-distorter (DPD) and a second DPD. A digital IF upconverter electrically coupled between the first and second DPDs separates the DPD system into independently controlled fine and coarse sections. The adaptive adjustment processor can be used to modify or pre-distort input signals in order to compensate for the power amplifier nonlinearity. It also controls the fine DPD section to correct an RF output signal single-band adjacent channel leakage ratio (ACLR), while it controls the coarse DPD section to correct an RF output signal dual band intermodulation distortion (IMD).

20 Claims, 4 Drawing Sheets

(56) References Cited

OTHER PUBLICATIONS

Lei Guan and Anding Zhu, Dual-loop Model Extraction for Digital Predistortion of Wideband RF Power Amplifiers, IEEE Microwave and Wireless Components Letters, vol. 21, No. 9, Sep. 2011, pp. 501-503.

Lei Ding, et. al., Concurrent Dual-band Digital Predistortion, IEEE Microwave Symposium Digest(MTT), IEEE MTT-S International, Institute of Electrical and Electronics, Jun. 17-22, 2012, pp. 1-3.

* cited by examiner

APPARATUS AND METHODS FOR DUAL LOOP POWER AMPLIFIER DIGITAL PRE-DISTORTION SYSTEMS

BACKGROUND

1. Field

Embodiments of the invention relate to electronic systems, and more particularly, to the linearization of power amplifiers using digital pre-distortion.

2. Description of the Related Technology

Digital pre-distortion can be used to linearize an RF system having a radio frequency (RF) power amplifier by pre-distorting an input signal to at least partially compensate for non-linearities in an RF power amplifier.

In practice there can be a bandwidth constraint. A challenge of a digital pre-distorter and a DPD system can be that the pre-distorter operates at a multiple of the signal bandwidth; this operation requirement can in turn lead to switching and calculation-rate related power consumption.

SUMMARY

One embodiment includes an apparatus, wherein the apparatus includes a first digital pre-distorter (DPD) configured to receive a first input signal having a first data rate and to modify the first input signal to generate a first modified signal in a manner that is at least partially complementary to a first distortion. The first distortion is observed as a difference between samples of a second sampled signal and symbols of the first input signal and the second sampled signal is derived from a radio frequency (RF) output signal of an RF power amplifier.

The apparatus further includes a first digital intermediate frequency (IF) upconverter configured to generate a first IF signal from the first modified signal, and the first IF signal has a second data rate that is higher than the first data rate and a frequency band centered at a first center frequency. The apparatus also includes a second DPD configured to receive at least the first IF signal as an input and to modify the at least first IF signal to generate a second modified signal in a manner that is at least partially complementary to a second distortion. The second distortion is observed as a difference between samples of a first sampled signal and symbols of the at least first IF signal; and the first sampled signal is derived from the RF output signal of the RF power amplifier.

One embodiment includes an electronically-implemented method of pre-distortion, wherein the method includes: pre-distorting a first input signal having a first data rate to generate a first modified signal in a manner that is at least partially complementary to a first distortion, wherein the first distortion is observed as a difference between samples of a second sampled signal and symbols of the first input signal wherein the second sampled signal is derived from a radio frequency (RF) output signal of an RF power amplifier; generating a first intermediate frequency (IF) signal from the first modified signal, wherein the first IF signal has a second data rate that is higher than the first data rate and a frequency band centered at a first center frequency and; pre-distorting at least the first IF signal to generate a second modified signal in a manner that is at least partially complementary to a second distortion, wherein the second distortion is observed as a difference between samples of a first sampled signal and symbols of the at least first IF signal wherein the first sampled signal is derived from the RF output signal of the RF power amplifier.

One embodiment includes an apparatus for digital pre-distortion, wherein the apparatus includes: a means for pre-distorting a first input signal having a first data rate to generate a first modified signal in a manner that is at least partially complementary to a first distortion, wherein the first distortion is observed as a difference between samples of a second sampled signal and symbols of the first input signal wherein the second sampled signal is derived from a radio frequency (RF) output signal of an RF power amplifier; a means for generating a first intermediate frequency (IF) signal from the first modified signal, wherein the first IF signal has a second data rate that is higher than the first data rate and a frequency band centered at a first center frequency and; a means for pre-distorting at least the first IF signal to generate a second modified signal in a manner that is at least partially complementary to a second distortion, wherein the second distortion is observed as a difference between samples of a first sampled signal and symbols of the at least first IF signal wherein the first sampled signal is derived from the RF output signal of the RF power amplifier.

BRIEF DESCRIPTION OF THE DRAWINGS

These drawings and the associated description herein are provided to illustrate specific embodiments of the invention and are not intended to be limiting.

DETAILED DESCRIPTION OF EMBODIMENTS

Figure 1:
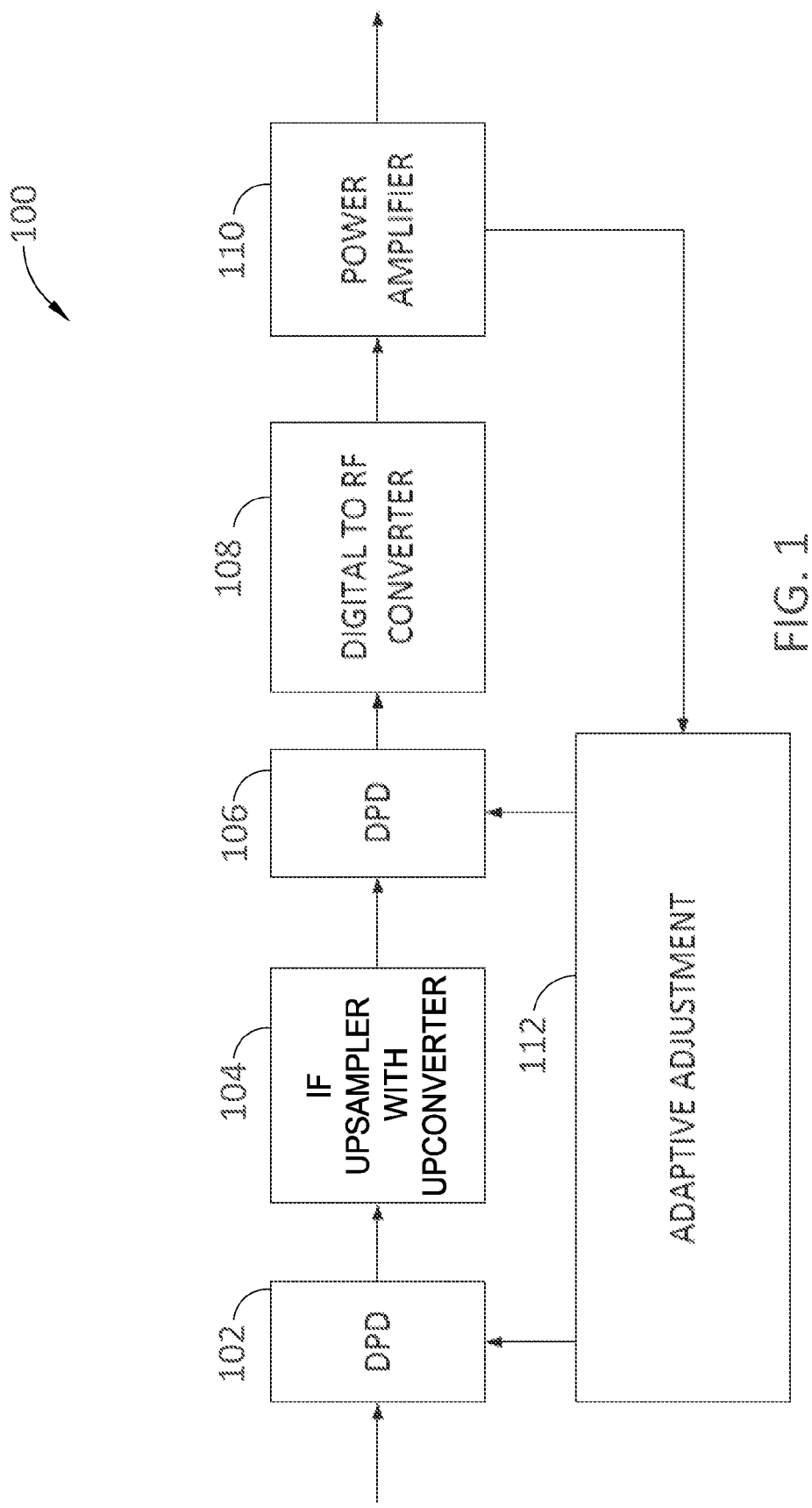
FIG. 1 is a schematic diagram of a dual-loop DPD system according to one embodiment of the invention.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

FIG. 1 is a schematic diagram of an amplifier system 100 according to one embodiment of the invention. The amplifier system 100 includes first and second DPDs 102 and 106, an intermediate frequency (IF) upsampler with upconverter 104, a digital to RF converter 108, an RF power amplifier 110, and an adaptive adjustment processor 112. The amplifier system 100 further includes an observation path from the RF power amplifier 110 to the adaptive adjustment processor 112 for adaptive adjustment of the first DPD 102 and the second DPD 106.

In the illustrated configuration, the first DPD 102, the digital IF upsampler with upconverter 104, the second DPD 106, the digital to RF converter 108, and the RF power amplifier 110 are cascaded in the amplifier system 100 as follows: an output of the first DPD 102 is coupled to an input of the digital IF upsampler with upconverter 104; an output of the digital IF upsampler with upconverter 104 is coupled to an input of the second DPD 106; an output of the second DPD 106 is coupled to an input of the digital to RF converter 108; and an output of the digital to RF converter 108 is coupled to an input of the RF power amplifier 110. For adaptive adjustment, a sample of the RF power amplifier 110 is provided as an input of the adaptive adjustment processor 112, and the adaptive adjustment processor 112 provides updated coefficients for pre-distortion to the second DPD 106 and to the first DPD 102.

In the illustrated configuration, an output of the RF power amplifier 110 can comprise the output of the amplifier system 100. The first DPD 102 can generate a first modified signal as an output, and the second DPD 106 can generate a second modified signal as an output. The first DPD 102 can receive configuration information from the adaptive adjustment processor 112 at the second input of the first DPD 102. The configuration information configures the first DPD 102 to pre-distort an input signal received at a first input of the first DPD 102 to generate the first modified signal. The configuration information can include, for example, coefficients for digital filters, lookup tables, and the like. The pre-distorted input signal should have a characteristic that is at least partially complementary to the distortion generated by the IF upsampler with upconverter 104, the second DPD 106, the digital-to-RF converter 108, and the RF power amplifier 110.

The second DPD 106 can receive configuration information from the adaptive adjustment processor 112 at the second input of the second DPD 106. The configuration information configures the second DPD 106 to pre-distort an IF signal received at a first input of the second DPD 106 to generate the second modified signal such that the pre-distortion of the second modified signal is at least partially complementary to the distortion generated by the digital-to-RF converter 108 and the RF power amplifier 110. The digital-to-RF converter 108 can generate a pre-distorted RF signal from the second modified signal. The digital-to-RF converter 108 can include, for example, digital to analog converters and upconverters as will be described later in connection with FIG. 3. The RF power amplifier 110 can amplify the pre-distorted RF signal to generate an amplified RF signal.

Also in the illustrated configuration, the first and second DPDs 102 and 106 with the adaptive adjustment processor 112 can independently pre-distort signals of the forward signal path. The digital IF upsampler with upconverter 104 is cascaded between the first DPD 102 and the second DPD 106 such that the first DPD 102 can receive and modify input signals while the second DPD 106 can receive and modify IF signals. Also, the input signals of the first DPD 102 can be digital baseband signals with a first data rate, while the IF signals of the second DPD 106 can be digital IF signals with a second data rate. The adaptive adjustment processor 112 can also adjust the first DPD 102 using a first method such as a DPD algorithm or a LUT (look-up table) at a first refresh rate. Also, the adaptive adjustment processor 112 can adjust the first DPD 102 to linearize the system output based upon observations of the RF output signal of the RF power amplifier 110. The adaptive adjustment processor 112 can further adjust the second DPD 106 to modify an IF signal using a second method such as a DPD algorithm or a LUT (look-up table) at a second refresh rate; and it can adjust the second DPD 106 to linearize the system output signal at the second output of the RF power amplifier 110 based on observations of the RF output signal of the RF power amplifier 110 and on the IF signal.

Provided herein are apparatus and methods for dual loop pre-distortion amplifiers. The first and second methods, or algorithms, and first and second data rates, can be independently selected and configured to reduce system power consumption when pre-distorting the signals to meet ACLR requirements. For instance, the adaptive adjustment processor 112 can adjust the second DPD 106 using a coarse, requiring fewer DSP operations, algorithm or LUT, using a faster second data rate suitable to meet the IMD calculation bandwidth requirement of an individual signal or non-contiguous carrier grouping. To improve the linearity of the coarse algorithm or LUT, the adaptive adjustment processor 112 can further adjust the first DPD 102 using a fine, requiring many DSP operations, algorithm or LUT, at a slower first data rate. For instance, the second data rate can be two times the first data rate. In this way the fine algorithm can further improve the system linearity and correct for ACLR linearity requirements of dual and multi-band signals. In addition, the adaptive adjustment processor 112 can continuously update or refresh the second DPD 106 and to intermittently update or refresh the first DPD 102 so as to meet the ACLR linearity requirements while reducing the total number of combined DSP operations of both the first and second DPDs 102 and 106.

Figure 2:
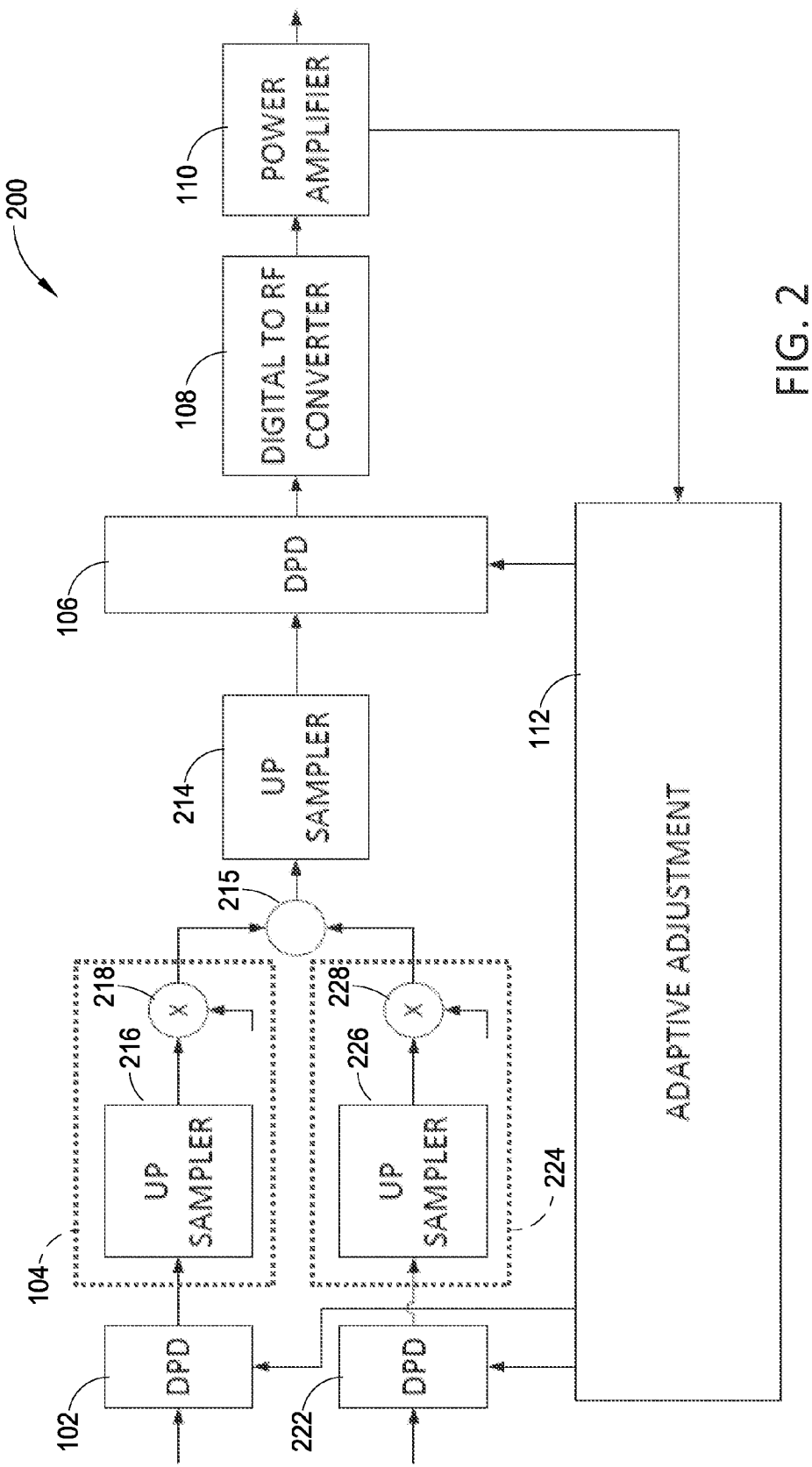
FIG. 2 is a schematic diagram of a dual-loop and dual-band DPD system according to another embodiment.

FIG. 2 is a schematic diagram of a dual-band amplifier system 200 according to another embodiment. Compared to the amplifier system 100 of FIG. 1, the dual-band DPD system 200 has parallel signal paths for a dual-band system. Similar to the system architecture of the amplifier system 100 of FIG. 1, the dual-band amplifier system 200 also uses adaptive adjustment for adjusting pre-distorters. The dual-band system 200 includes first, second, and third DPDs 102, 106, 222, first, second, and third upsamplers 216, 226, 214, first and second mixers 218, 228, a digital to RF converter 108, an RF power amplifier 110, and an adaptive adjustment processor 112. The dual band system 200 also has a return path from the RF power amplifier 110 to the adaptive adjustment processor 112.

In the illustrated configuration, the first DPD 102 can receive a first input signal at a first input of the first DPD 102; while the third DPD 222 can receive a second input signal at a first input of the third DPD 222. Here both the first and second input signals can be digital baseband signals; and the first and third DPDs 102 and 222 can provide a first and third modified signal, respectively. Moreover, the first input signal can have a first data rate while the third input signal can have a third data rate different from the first data rate. The first and third modified signals can also be digital baseband signals modified by the first and third DPDs, respectively. In addition the first mixer 218 can receive a first IF signal of a first frequency at a second input of the first mixer 218; while the second mixer 228 can receive a second IF signal of a second frequency at a second input of the second mixer 228. In this way the first upsampler 216 and the first mixer 218 can operate as a first digital IF upsampler with upconverter 104 configured to provide an IF signal having a first center frequency; while the second upsampler 226 and the second mixer 228 can operate as a second digital IF upconverter 224 configured to provide an IF signal having a second center frequency. The adder 215 can be configured to receive and to combine the IF signals of the first and second IF frequencies at the first and second inputs of the adder 215 so as to provide a combined signal at the output of the adder 215. The third upsampler 214 can receive the combined signal at the input of the third upsampler 214 and to upsample the combined signal to provide an upsampled combined signal to the first input of the second DPD 106. In addition, the combined and the upsampled combined signals can be dual-band digital signals having the first and second center frequencies; and the upsampled combined signals can also have a second data rate.

Also in the illustrated configuration, the first, second, and third DPDs 102, 106, and 222 with the adaptive adjustment processor 112 can independently pre-distort signals of the forward signal path. The first and third DPDs 102 and 222 can receive and pre-distort digital baseband signals while the second DPD 106 can receive and pre-distort IF upconverted digital signals of an intermediate frequency. The adaptive adjustment processor 112 can adjust the second DPD 106 to pre-distort and to modify IF signals using a second method such as a DSP algorithm or LUT at a second refresh rate. The adaptive adjustment processor 112 can further adjust the second DPD 106 to linearize the system output based upon observations of a sampled RF output signal from the first output of the RF power amplifier 110 and upon the upsampled combined signal. It can also adjust the first DPD 102 using a first method such as a DSP algorithm or LUT at a first refresh rate; and it can adjust the first DPD 102 to linearize the output based upon observations of a sampled RF signal from the first output of the RF power amplifier 110 and upon the first input signal. In parallel with adaptively adjusting the first DPD 102, the adaptive adjustment processor 112 can similarly adjust the third DPD 222 using a third method at a third refresh rate; and it can adjust the third DPD 222 to linearize the output based upon observations of a sampled RF output signal from the first output of the RF power amplifier 110.

Similar to the amplifier system 100 of FIG. 1, the dual band amplifier system 200 includes the digital to RF converter 108. In this configuration, the digital to RF converter 108 can convert a second modified signal from the output of the second DPD 106 into an RF signal. The second modified signal can be a digital signal having both the first and second center IF frequencies. The RF power amplifier 110 can receive and amplify the RF signal received at the input of the RF power amplifier 110 so as to provide an RF output signal at the first and second outputs of the RF power amplifier 110. By virtue of the first, second, and third DPDs 102, 106, 222, the RF output signal can be a dual band RF signal having low intermodulation distortion and ACLR.

The dual band amplifier system 200, similar to that of the amplifier system 100 of FIG. 1, can linearize such that the first, second, and third DPDs 102, 106, and 222 are adjusted to pre-distort, meaning to modify, independently. The first, second, and third methods, or algorithms, and first, second, and third data rates, can be independently selected and configured to reduce system power consumption when pre-distorting the signals to meet ACLR requirements. For instance, the adaptive adjustment processor 112 can adjust the second DPD 106 using a coarse, requiring fewer DSP operations, algorithm or LUT, at a faster second data rate suitable to meet the IMD calculation bandwidth requirement of an individual signal or non-contiguous carrier grouping. To improve the linearity of the coarse algorithm or LUT, the adaptive adjustment processor 112 can further adjust the first DPD 102 using a fine, requiring many DSP operations, algorithm or LUT, at a slower first data rate. Independently, the adaptive adjustment processor 112 can also adjust the third DPD 222, in parallel, using a fine algorithm or LUT, at a slower third data rate. In addition, the adaptive adjustment processor 112 can continuously update or refresh the second DPD 106 and intermittently update or refresh the first and third DPDs 102 and 222 so as to meet the ACLR linearity requirements while reducing the total number of combined DSP operations of the first, second, and third DPDs 102, 106, and 222. In this way the fine algorithm can further improve the system linearity and correct for intermodulation distortion terms of dual and multi-band signals. Moreover, by virtue of independently operating first, second, and third DPDs 102, 106, 222, the dual-band amplifier system 200 can achieve acceptable ACLR with lower power consumption.

Although FIG. 2 illustrates the dual-band amplifier system 200 as having first and second digital IF upsampler with upconverters 104, 224 with first and third DPDs 102, 222, other configurations are possible. For instance, the dual-band amplifier system 200 can have a plurality of digital IF upconverters and a plurality of DPDs which can receive digital baseband signals. The plurality of digital IF upconverters can upconvert the parallel signals to IF frequencies, and an adder can combine the parallel IF upconverted signals. In this way the dual-band amplifier system 200 can be configured as a multi-band DPD system. Further, the teachings herein for dual band DPD systems can also apply to multi-band DPD systems.

Figure 3:
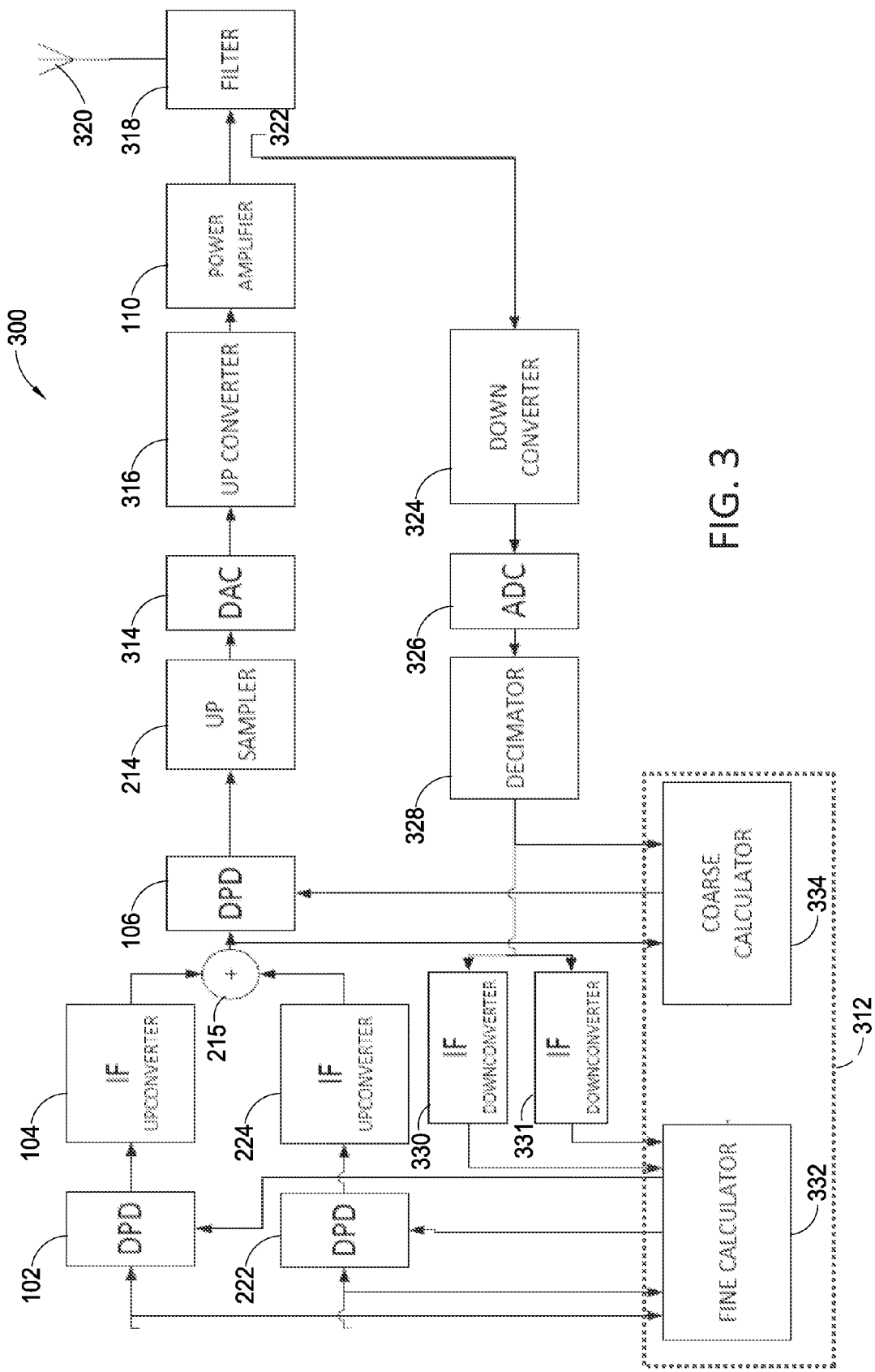
FIG. 3 is a schematic diagram of a dual-band DPD system according to another embodiment.

FIG. 3 is a schematic diagram of a dual-band amplifier system 300 according to another embodiment. In this illustration the system level schematic includes additional system level blocks and signal paths to further detail the dual band DPD architecture. Similar to the dual-band amplifier system 200 of FIG. 2, the dual-band amplifier system 300 is a pre-distortion system which can sample an RF output signal from an RF power amplifier 110 in order to linearize the system response and to meet an ACLR requirement of dual band signals. In a forward path from left to right the dual-band amplifier system 300 includes first and third DPDs 102, 222, first and second digital IF upsampler with upconverters 104, 224, an adder 215, a second DPD 106, an upsampler 214, a digital-to-analog converter (DAC) 314, an RF upconverter 316, an RF power amplifier 110, a filter 318, and an antenna 320. In an observation path from right to left, the dual-band amplifier system 300 includes an RF coupler 322, an RF downconverter 324, an analog to digital converter (ADC) 326, a decimator 328, and first and second IF downconverters 330, 331. The dual-band amplifier system 300 further includes an adaptive adjustment processor 312 having a coarse calculator 334 and a fine calculator 332.

In the illustrated configuration the first DPD 102 can receive a first input signal at a first input of the first DPD 102; while the third DPD 222 can receive a second input signal at a first input of the third DPD 222. Here, both the first and second input signals can be digital baseband signals; and the first and third DPDs 102, 222 can provide first and third modified signals, respectively, which can also be digital baseband signals. The first input signal can have the same or different data rates. The first digital IF upsampler with upconverter 104 can receive the first modified signal from the first DPD 102 and convert the first modified signal to a first IF signal, while the second digital IF upconverter 224 can receive a third modified signal from the third DPD 222 and convert the third modified signal to a second IF signal. The adder 215 can receive and combine the first and second IF signals so as to provide a combined IF signal having dual IF bands similar to that described in the dual-band amplifier system 200 of FIG. 2. In alternative embodiments, there can be additional streams of information for additional bands, which can be upconverted to yet another intermediate frequency band and summed by the adder 215.

The second DPD 106 can receive the combined IF signal from the output of the adder 215. The second DPD 106 can generate a second modified signal as an output. The second DPD 106 can receive configuration information from the course calculator 334 of the adaptive adjustment processor 312 at a second input of the second DPD 106. The configuration information configures the second DPD 106 to pre-distort the combined IF signal received at a first input of the second DPD 106 to generate the second modified signal such that the pre-distortion of the second modified signal is at least partially complementary to the distortion generated by the RF upconverter 316 and the RF power amplifier 110.

The boundary between digital signals and analog signals in the dual-band amplifier system 300 can be delineated in the forward signal path by the DAC 314. The upsampler 214 can provide an upsampled signal having a first and second center frequency of an IF band to the DAC 314. The DAC 314 can receive the upsampled signal and to convert it an analog IF signal. The RF upconverter 316 can then receive the analog IF signal and to further convert it so as to provide an RF signal to the RF power amplifier 110. The RF power amplifier 110 can then receive and to amplify the RF signal to provide an output RF signal at the output of the RF power amplifier 110. The filter 318 can provide a filtered output RF signal to the antenna 320 and filters out out-of-bad spectral emissions to meet spectral requirements. One benefit of the techniques disclosed herein is that out-of-band emissions from the power amplifier 110 can be reduced over prior techniques, so that a simpler and less expensive filter 318 can be utilized, which can reduce overall system cost. Although FIG. 3 shows one embodiment including both the DAC 314 and the upsampler 214, other embodiments are possible. For instance, in alternative embodiments, the upsampler 214 can be excluded or be considered optional. In this realization, the DAC 314 can receive the second modified signal from the second DPD 106 and can convert the second modified signal to an analog RF signal, which is provided as an input to the RF power amplifier 110.

With respect to the RF power amplifier 110, the RF coupler 322 can provide a sampled output of the RF output signal; therefore, the RF coupler 322 with the RF power amplifier 110 can operate similar to the second output of the RF power amplifier 110 of FIGS. 1 and 2. The RF coupler 322, which can be a directional coupler, can provide a sample of the RF output signal to the RF downconverter 324. The RF downconverter 324 can then receive the sample of the RF output and generate a first downconverted signal. The first downconverted signal can be an analog signal of an IF band.

In the illustrated configuration the boundary between analog signals and digital signals in the dual-band amplifier system 300 can be delineated in the observation signal path by the ADC 326. The ADC 326 can receive the first downconverted signal and to generate a first digital downconverted signal. The decimator can receive the first digital downconverted signal and to generate a first decimated signal. The first decimated signal can be a digital signal of an IF band and can have the second data rate.

Although FIG. 3 shows one embodiment including both the ADC 326 and the RF downconverter 324, other embodiments are possible. For instance, in alternative embodiments, the RF downconverter 324 can be excluded or be considered optional. In this realization, the ADC 326 can receive the sample of the RF output from the RF coupler 322 without downconversion, and can also perform direct downconversion from the RF band to provide the first digital downconverted signal.

The adaptive adjustment processor 312 can adjust the first, second, and third DPDs 102, 106, and 222 in a similar manner as that described for the adaptive adjustment processor 112 of the dual-band amplifier system 200 of FIG. 2. In the illustrated configuration the dual-band amplifier system 300 provides more detail on the architecture surrounding the adaptive adjustment processor 312 through its subcircuits, the coarse calculator 334 and the fine calculator 332. The coarse calculator 334 can adjust the second DPD 106 by performing calculations and then by providing the results of the calculations to the second DPD 106 at the second input of the second DPD 106. The fine calculator 332 can adjust the first and third DPDs 102 and 222 by performing calculations and then providing the results of the calculations to the second terminal of the first DPD 102 and the second terminal of the third DPD 222, respectively. The operations of the coarse and fine calculators 334 and 332 can be performed by a DSP and existing techniques and techniques yet to be invented can be used. For example, see CAVERS, J. K., *Amplifier linearization using a digital predistorter with fast adaptation and low memory requirements*, IEEE Transactions on Vehicular Technology, Vol. 39, Issue 4, pages 374-382, November, 1990.

The coarse calculator 334 can adaptively adjust the predistortion coefficients of the second DPD 106 by comparing the first decimated signal from the output of the decimator 328 with the combined signal from the output of the adder 215. The coarse calculator 334 can receive the first decimated signal having the second data rate at the first input of the coarse calculator 334 and to receive the combined signal also having the second data rate at the second input of the coarse calculator 334. The coarse calculator 334 can further use techniques well known to those practiced in the art of digital pre-distortion systems to adjust the system such that the RF signal output at the output of the RF power amplifier 110 has a coarse degree of gain linearity with the combined signal. For instance, the course calculator 334 can use a Volterra model, a Wiener model, a Hammerstein model, a Wiener-Hammerstein model, a memory polynomial model, or a least-squares algorithm to adjust the predistortion coefficients of the second DPD 106. The coarse calculator 334 can further provide a signal or signals so as to adjust the second DPD 106 to generate a second modified signal at the output of the second DPD 106. Further, with respect to the dual band IMD criteria, the coarse degree of gain linearity can manifest itself in a measurement of IMD terms of the RF signal output; and the second DPD in providing the second modified signal can correct the IMD of the dual band RF output signal at the output of the RF power amplifier 110.

Algorithms for calculating the coefficients of the second DPD 106 can be derived using matrix notation. The data at the output of the decimator 328 can be expressed by a data matrix FD given in Equation 1 in terms of the scalar components fd(n).

$$FD = \begin{bmatrix} fd(3) & fd(2) & fd(1) & fd(3)|fd(3)|^2 & fd(2)|fd(2)|^2 & fd(1)|fd(1)|^2 \\ \ldots & \ldots & \ldots & \ldots & \ldots & \ldots \\ fd(n+2) & fd(n+1) & fd(n) & fd(n+2)|fd(n+2)|^2 & fd(n+1)|fd(n+1)|^2 & fd(n)|fd(n)|^2 \end{bmatrix} \quad \text{Eq. 1}$$

Within the coarse calculator 334, a vector c of reverse PA model coefficients can be calculated using Equation 2:

$$c = \text{inv}(FD'*FD)*FD*d \quad \text{Eq. 2}$$

Here the primed matrix FD' represents the transpose of FD, d represents the vector of input data to the second input of the second DPD 106, and inv represents the inverse matrix operator. An expression relating elements of the input data din(n) to elements the output data dout(n) of the second DPD 106 and to the coarse calculator coefficient vector c can be given by Equation 3.

$$\begin{vmatrix} dout(3) \\ \cdots \\ dout(n+2) \end{vmatrix} = \begin{bmatrix} din(3) & din(2) & din(1) & din(3)|din(3)|^2 & din(2)|din(2)|^2 & din(1)|din(1)|^2 \\ \cdots & \cdots & \cdots & \cdots & \cdots & \cdots \\ din(n+2) & din(n+1) & din(n+1) & din(n+2)|din(n+2)|^2 & din(n+1)|din(n+1)|^2 & din(n)|din(n)|^2 \end{bmatrix} \begin{vmatrix} c_{10} \\ c_{11} \\ c_{12} \\ c_{30} \\ c_{31} \\ c_{32} \end{vmatrix} \quad \text{Eq. 3}$$

The fine calculator 332 with the first and third DPDs 102 and 222 can operate as part of additional adaptive adjustment loops. In contrast to the coarse calculator 334, the fine calculator 332 can receive baseband signals. The fine calculator 332 can receive the first and second input signals at the fourth and third inputs of the fine calculator 332, respectively. As shown in the illustrated configuration, the number of IF converters can be equal to the number of input signals. In this regard the first and second IF downconverters 330 and 331 can receive the first decimated signal to generate a first and second digital baseband signal, respectively. The fine calculator 332 can also receive the first and second digital baseband signals at the second and first inputs of the fine calculator 332, respectively.

The fine calculator 332 can further use techniques well known to those practiced in the art of digital pre-distortion systems to adjust the system such that the RF signal output at performing fine calculations for adjusting the first DPD 102; while it can use the second input signal and the second digital baseband signal in performing fine calculations for adjusting the third DPD 222.

Algorithms for calculating the coefficients of the first DPD 102 and the third DPD 222 can also be derived using matrix notation. Similar to Equation 2, a matrix equation for determining the reverse PA model coefficients of the fine calculator 332 can be expressed by Equation 4.

$$ca = \text{inv}(FA'^*FA)^*FA^*da \quad \text{Eq. 4}$$

Here the elements fa(n) represent the data output from the first IF downconverter 330. A similar relationship can hold for elements fb(n) of data output from the second IF downconverter 331. The matrix FA can be as expressed in Equation 5.

$$FA = \begin{bmatrix} fa(m) \cdots & fa(m)|fa(m)|^{2l} \cdots & fa(m)|fb(m)|^{2k} \cdots & fa(m)|fb(m)|^{2k}|fa(m)|^{2l} \cdots \\ fa(1) & fa(1)|fa(1)|^{2l} & fa(1)|fb(1)|^{2k} & fa(1)|fb(1)|^{2k}|fb(1)|^{2l} \\ \cdots \\ fa(N+m-1) \cdots & fa(n+m-1)|fa(n+m-1)|^{2l} \cdots & fa(n+m-1)|fb(n+m-1)|^{2k} \cdots & fa(n+m-1)|fb(n+m-1)|^{2k} \\ fa(n) & fa(n)|fa(n)|^{2l} & fa(n)|fb(n)|^{2k} & |fa(n+m-1)|^{2l}fa(n)|fbn|^{2k}|fb(n)|^{2l} \end{bmatrix} \quad \text{Eq. 5}$$

the output of the RF power amplifier 110 has a fine degree of gain linearity with the first and second input signals. For instance, the fine calculator 332 can use the Volterra model, a Wiener model, the Hammerstein model, the Wiener-Hammerstein model, the memory polynomial model, or the least-squares algorithm to adjust the predistortion coefficients of the first DPD 102 and the third DPD 222. The fine calculator 332 can provide a signal or signals to the second input of the first DPD 102 so as to adjust the first DPD 102 to generate a first modified signal at the output of the first DPD 102. The fine calculator 332 can also provide a signal or signals to the second input of the third DPD 222 so as to adjust the third DPD 222 to generate a third modified signal at the output of the third DPD 222.

In the illustrated configuration the fine calculator 332 can use the first input signal and the first digital baseband signal in In Equation 5 the indices n are from 1 to N. Similar to Equation 3, a matrix equation relating the input and output coefficients of the first DPD 102 can be given by Equations 6 and 7.

$$FA = \begin{bmatrix} fa(m) \cdots & fa(m)|fa(m)|^{2l} \cdots & fa(m)|fb(m)|^{2k} \cdots & fa(m)|fb(m)|^{2k}|fa(m)|^{2l} \cdots \\ fa(1) & fa(1)|fa(1)|^{2l} & fa(1)|fb(1)|^{2k} & fa(1)|fb(1)|^{2k}|fb(1)|^{2l} \\ \cdots \\ fa(N+m-1) \cdots & fa(n+m-1)|fa(n+m-1)|^{2l} \cdots & fa(n+m-1)|fb(n+m-1)|^{2k} \cdots & fa(n+m-1)|fb(n+m-1)|^{2k} \\ fa(n) & fa(n)|fa(n)|^{2l} & fa(n)|fb(n)|^{2k} & |fa(n+m-1)|^{2l}fa(n)|fbn|^{2k}|fb(n)|^{2l} \end{bmatrix} \quad \text{Eq. 6}$$

$$\begin{vmatrix} daout(3) \\ \cdots \\ daout(n+2) \end{vmatrix} = DA_{in} * ca \quad \text{Eq. 7}$$

The same algorithm or a different algorithm can be used for calculating the coefficients of the third DPD 222.

With respect to the ACLR criteria, the fine degree of gain linearity can manifest itself in a measurement of an individual signal of the RF signal output; and the first and third DPDs 102 and 222 by providing the first and third modified signals can correct the ACLR of single-banded RF output signals of the RF power amplifier 110.

Although FIG. 3 illustrates the dual-band amplifier system 300 as having two bands with first and second digital IF upsampler with upconverters 104, 224 with first and third DPDs 102, 222, other configurations are possible. For instance, the dual-band amplifier system 300 can have more than two digital IF upconverters, more than three DPDs, and more than two IF downconverters which can allow more than two band signals. For example, the number of bands can be 3, 4, 5, and more. The plurality of digital IF upconverters can upconvert the parallel signals to IF frequencies and an adder can combine the parallel IF upconverted signals. The plurality of IF downconverters can receive the first decimated signal; and the plurality of IF downconverters can further generate a plurality of digital baseband signals for the fine calculator 332. In this way the dual-band amplifier system 300 can be configured as a multi-band DPD system. Further, the teachings herein for dual band DPD systems can also apply to multi-band DPD systems.

Various blocks of the amplifier systems 100, 200, 300 can be implemented by hardware, by software/firmware, or by a combination of hardware and software/firmware. For example, with respect to the amplifier system 300 of FIG. 3, the DPDs 102, 106, 222, the digital IF upsampler with upconverters 104, 224, the adder 215, the up sampler 214, the decimator 328, and the IF downconverters 330, 331 can be implemented by digital hardware, such as on an application specific integrated circuit (ASIC), field-programmable gate array (FPGA), programmable logic device (PLD), discrete logic circuits or the like. The adaptive adjustment processor 312 can be implemented by hardware or by software/firmware instructions stored in a tangible, computer-readable memory, which are executed by a processor, such as a digital signal processor, a microprocessor, a microcontroller, a licensable core or the like, or by a combination of both hardware and software/firmware.

Figure 4:
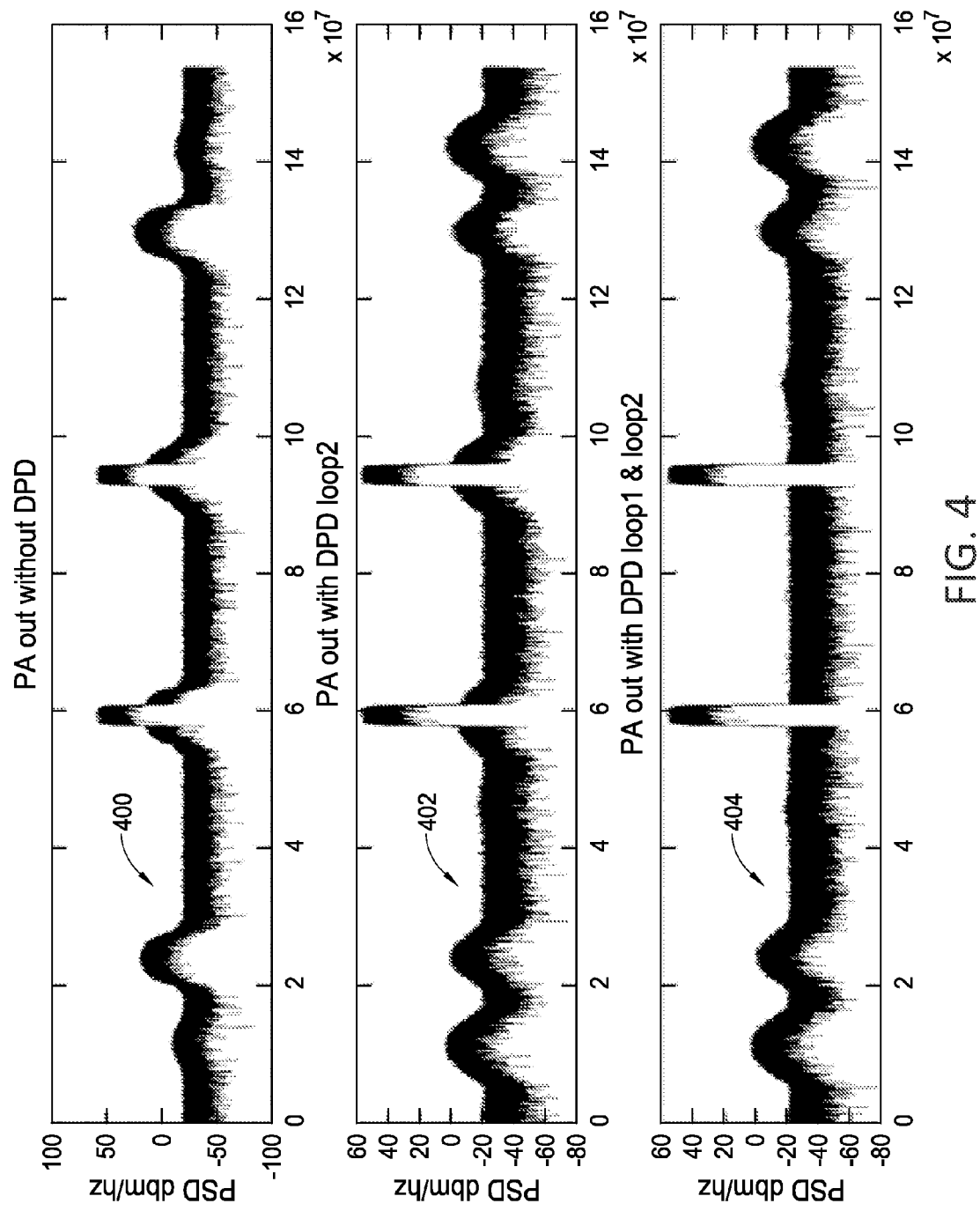
FIG. 4 illustrates power spectral density (PSD) simulation results.

FIG. 4 illustrates power spectral density (PSD) simulation results of an embodiment of a dual-band DPD system without activation of either DPD, with only second-loop DPD, and with both first-loop and second-loop DPD. The first PSD plot 400 is a simulation result of an embodiment such as that shown in FIG. 3 where none of the first, second, or third DPDs 102, 106, 222 is active. The second PSD plot 402 is a simulation result with the second DPD 106 active. For instance, this can represent an adjustment of the second DPD 106 by the coarse calculator 334. The third PSD plot 404 is a simulation result showing a fine first-loop adjustment with a coarse second-loop adjustment. For instance, the third PSD plot 404 can represent an adjustment of the second DPD 106 by the coarse calculator 334 followed by an adjustment of the first and third DPDs 102, 222 by the fine calculator 332. Comparison of the simulation results represented by first PSD plot 400 and the second PSD plot 402 indicates that the second DPD 106 reduces the IMD bands by approximately 15 dB. This reduction supports the concept that the coarse calculator 334 with the second DPD 106 can reduce the IMD distortion to a level suitable for simple filtering. For instance, a duplexer can be used to further reduce the IMD bands and any higher-order harmonics of noise. Comparison of the second PSD plot 402 with the third PSD plot 404 shows a reduction of primary tone sideband leakage from approximately 15 dB to approximately −15 dB. This leakage reduction supports the concept that the fine calculator 332 with the first and third DPDs 102, 222 can reduce ACLR, which can advantageously save costs associated with complex filters for the filter 318.

Applications

Devices employing the above described schemes can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An apparatus comprising:
a first digital pre-distorter (DPD) configured to receive a first input signal having a first data rate and to modify the first input signal to generate a first modified signal in a manner that is at least partially complementary to a first distortion, wherein the first distortion is observed as a difference between samples of a second sampled signal and symbols of the first input signal wherein the second sampled signal is derived from a radio frequency (RF) output signal of an RF power amplifier;
a first digital intermediate frequency (IF) upsampler with upconverter configured to generate a first IF signal from the first modified signal, wherein the first IF signal has a second data rate that is higher than the first data rate and a frequency band centered at a first center frequency; and
a second DPD configured to receive at least the first IF signal as an input and to modify the at least first IF signal to generate a second modified signal in a manner that is at least partially complementary to a second distortion, wherein the second distortion is observed as a difference between samples of a first sampled signal and symbols of the at least first IF signal wherein the first sampled signal is derived from the RF output signal of the RF power amplifier.

2. The apparatus of claim 1, further comprising:
a third digital pre-distorter configured to receive a second input signal and to modify the second input signal to generate a third modified signal in a manner that is at least partially complementary to a third distortion, wherein the third distortion is observed as a difference between samples of a third sampled signal and symbols of the second input signal, wherein the third sampled signal is derived from the RF output signal of the RF power amplifier; and a second digital intermediate frequency (IF) upconverter configured to generate a second IF signal from the third modified signal, wherein the second IF signal has a frequency band centered at a second center frequency that is different from the first center frequency;

wherein the second digital pre-distorter is further configured to receive two or more IF signals including at least the first IF signal and the second IF signal.

3. The apparatus of claim 2, wherein the first digital IF upsampler with upconverter is configured to generate the first IF signal, and the second digital IF upconverter is configured to generate the second IF signal by multiplying the first modified signal and the third modified signal by a first IF oscillator signal and a second IF oscillator signal, respectively.

4. The apparatus of claim 2, further comprising:
an adder configured to sum two or more IF signals including at least the first IF signal and the second IF signal to generate a combined signal; and
an upsampler configured to upsample the combined signal to generate an upsampled combined signal, wherein the upsampled combined signal is provided as an input to the second digital pre-distorter.

5. The apparatus of claim 2, further comprising:
an RF downconverter configured to receive a sample of the RF output signal of the RF power amplifier and to generate a downconverted signal;
an analog-to-digital converter configured to receive the downconverted signal and to generate a digital downconverted signal;
a decimator configured to receive the digital downconverted signal and to generate a first sampled signal;
a first IF downconverter configured to receive and downconvert the first sampled signal, and to generate a second sampled signal; and
a second IF downconverter configured to receive and downconvert the first sampled signal, and to generate a third sampled signal, wherein second IF downconverter operates at a different center frequency than the first IF downconverter.

6. The apparatus of claim 2, further comprising an adaptive adjustment processor configured to update one or more parameters of the first digital pre-distorter based on the first distortion, update one or more parameters of the second digital pre-distorter based on the second distortion, and update one or more parameters of the third digital pre-distorter based on the third distortion, wherein the adaptive adjustment processor is configured to perform the updates in a sequence such that second digital pre-distorter is adjusted before the first and third digital pre-distorters are adjusted.

7. The apparatus of claim 6:
wherein the first digital pre-distorter and the third digital pre-distorter are configured to at least partially correct at least for an adjacent channel leakage ratio (ACLR) between two or more bands;
wherein the second digital pre-distorter is configured to at least partially correct for intermodulation distortion generated by the two or more bands.

8. The apparatus of claim 7, wherein the adaptive adjustment processor is configured to determine coefficients for the second pre-distorter using one of a Volterra model, a Wiener model, a Hammerstein model, a Wiener-Hammerstein model, a memory polynomial model, or a least-squares algorithm, and the adaptive adjustment processor is configured to determined coefficients for the first pre-distorter and the third pre-distorter using one of the Volterra model, the Wiener model, the Hammerstein model, the Wiener-Hammerstein model, the memory polynomial model, or the least-squares algorithm.

9. The apparatus of claim 1 wherein the first digital IF upsampler with upconverter is configured to generate the first IF signal such that the second data rate is at least two times the first data rate.

10. The apparatus of claim 1, further comprising an adaptive adjustment processor configured to update one or more parameters of the first digital pre-distorter based on the first distortion and update one or more parameters of the second digital pre-distorter based on the second distortion, wherein the adaptive adjustment processor is configured to perform the updates in a sequence such that second digital pre-distorter is adjusted before the first digital pre-distorter is adjusted.

11. The apparatus of claim 1:
wherein the first digital pre-distorter is configured to perform pre-distortion over a first bandwidth;
wherein the second digital pre-distorter is configured to perform pre-distortion over a second bandwidth;
wherein the second bandwidth is greater than the first bandwidth.

12. The apparatus of claim 1, further comprising:
a digital-to-analog converter configured to generate an analog modified signal from the second modified signal;
an RF upconverter configured to upconvert the analog modified signal to generate an upconverted signal comprising one or more RF bands including at least a first RF band; and
an RF downconverter configured to receive a sample of the RF output signal of the RF power amplifier and to generate a first downconverted signal, wherein the first sampled signal and the second sampled signal are derived from the first downconverted signal.

13. An electronically-implemented method of pre-distortion, the method comprising:
pre-distorting a first input signal having a first data rate to generate a first modified signal in a manner that is at least partially complementary to a first distortion, wherein the first distortion is observed as a difference between samples of a second sampled signal and symbols of the first input signal wherein the second sampled signal is derived from a radio frequency (RF) output signal of an RF power amplifier;
generating a first intermediate frequency (IF) signal from the first modified signal, wherein the first IF signal has a second data rate that is higher than the first data rate and a frequency band centered at a first center frequency; and
pre-distorting at least the first IF signal to generate a second modified signal in a manner that is at least partially complementary to a second distortion, wherein the second distortion is observed as a difference between samples of a first sampled signal and symbols of the at least first IF signal wherein the first sampled signal is derived from the RF output signal of the RF power amplifier.

14. The method of claim 13, further comprising:
generating an analog modified signal from the second modified signal; and
upconverting the analog modified signal to generate an upconverted signal comprising one or more RF bands including at least a first RF band; and
receiving a sample of the RF output signal of the RF power amplifier and generating a first downconverted signal, wherein the first sampled signal and the second sampled signal are derived from the first downconverted signal.

15. The method of claim 13, further comprising:
receiving a combined signal including at least the first IF signal and the second IF signal;
receiving a second input signal and modifying the second input signal to generate a third modified signal in a manner that is at least partially complementary to a third distortion, wherein the third distortion is observed as a difference between samples of a third sampled signal and symbols of the second input signal, wherein the third sampled signal is derived from the RF output signal of the RF power amplifier; and
upconverting the third modified signal to generate a second IF signal, wherein the second IF signal has a frequency band centered at a second center frequency that is different from the first center frequency.

16. The method of claim 15, further comprising:
generating the first IF signal by multiplying the first modified signal and a first IF oscillator signal; and
generating the second IF signal by multiplying the third modified signal by a second IF oscillator signal.

17. The method of claim 15, further comprising:
summing two or more IF signals including at least the first IF signal and the second IF signal to generate the combined signal; and
upsampling the combined signal to generate an upsampled combined signal, wherein the upsampled combined signal, wherein pre-distorting at least the first IF signal comprises pre-distorting the upsampled combined signal.

18. The method of claim 15, further comprising:
receiving and downconverting a sample of the RF output signal of the RF power amplifier to generate a downconverted signal;
converting the downconverted signal from analog to digital to generate a digital downconverted signal;
decimating the digital downconverted signal to generate a first sampled signal;
downconverting the first sampled signal to generate a second sampled signal; and
downconverting the first sampled signal to generate a third sampled signal, wherein the second sampled signal and the third sampled signal are downconverted from different IF center frequencies.

19. The method of claim 15, further comprising
updating one or more parameters for predistortion of the first input signal based on the first distortion;
updating one or more parameters for pre-distortion of the combined signal based on the second distortion; and
updating one or more parameters for pre-distortion of the second input signal on the third distortion;
wherein the pre-distortion of the first input signal and the pre-distortion of the second input signal are configured to at least partially correct at least for an adjacent channel leakage ratio (ACLR) between two or more bands;
wherein the pre-distortion of the combined signal is configured to at least partially correct for intermodulation distortion generated by the two or more bands.

20. An apparatus for digital pre-distortion comprising:
a means for pre-distorting a first input signal having a first data rate to generate a first modified signal in a manner that is at least partially complementary to a first distortion, wherein the first distortion is observed as a difference between samples of a second sampled signal and symbols of the first input signal wherein the second sampled signal is derived from a radio frequency (RF) output signal of an RF power amplifier;
a means for generating a first intermediate frequency (IF) signal from the first modified signal, wherein the first IF signal has a second data rate that is higher than the first data rate and a frequency band centered at a first center frequency; and
a means for pre-distorting at least the first IF signal to generate a second modified signal in a manner that is at least partially complementary to a second distortion, wherein the second distortion is observed as a difference between samples of a first sampled signal and symbols of the at least first IF signal wherein the first sampled signal is derived from the RF output signal of the RF power amplifier.

\* \* \* \* \*